(12) United States Patent
Johnson et al.

(10) Patent No.: US 7,258,569 B1
(45) Date of Patent: Aug. 21, 2007

(54) CONNECTOR-ALIGNMENT COLLAR FOR BLIND MATING ELECTRICAL CONNECTORS

(75) Inventors: Keith Johnson, Medway, MA (US); John Palker, South Grafton, MA (US); Robert P. Wierzbicki, Worcester, MA (US)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 11/393,339

(22) Filed: Mar. 30, 2006

(51) Int. Cl.
*H01R 13/64* (2006.01)
(52) U.S. Cl. .......................... 439/378; 439/74; 439/374
(58) Field of Classification Search ................ 439/378, 439/637, 36, 144, 147–150, 180, 345, 65, 439/74, 374, 76.1, 680
See application file for complete search history.

(56) References Cited

U.S. PATENT DOCUMENTS

| | | | |
|---|---|---|---|
| 5,073,042 A * | 12/1991 | Mulholland et al. .......... | 385/69 |
| 5,223,674 A | 6/1993 | Reznikov | |
| 5,268,820 A | 12/1993 | Tseng et al. | |
| 6,004,140 A * | 12/1999 | Kato et al. .................... | 439/65 |
| 6,109,930 A | 8/2000 | Koschmeder et al. | |
| 6,402,549 B1 | 6/2002 | Ayres et al. | |
| 6,603,664 B1 | 8/2003 | Gallarelli et al. | |
| 6,603,669 B2 | 8/2003 | Sheen et al. | |
| 6,801,434 B2 | 10/2004 | Gallarelli et al. | |
| 6,813,165 B2 | 11/2004 | Cheng et al. | |
| 6,923,679 B1 | 8/2005 | Wu | |
| 2005/0006118 A1 | 1/2005 | King, Jr. et al. | |

* cited by examiner

*Primary Examiner*—Michael C. Zarroli
(74) *Attorney, Agent, or Firm*—Guerin + Rodriguez LLP; Michael A. Rodriguez

(57) ABSTRACT

Described are an apparatus and method for blind mating electrical connectors. A connector-alignment collar includes a frame with a multi-sided base portion. The sides of the base portion define an area within which to receive a connector closely. A guide cantilever extends substantially perpendicularly from the base portion at a first side of the frame, and an alignment cantilever extends substantially perpendicularly from the base portion at a second side of the frame opposite the first side. The connector-alignment collar is placed around a first electrical connector on a first circuit board. The alignment cantilever is inserted into an alignment hole in the second circuit board while a guide notch in an edge of the second circuit board is urged against the guide cantilever. After the alignment cantilever is inserted into the alignment hole in the second circuit board, the first electrical connector on the first circuit board mates with the second electrical connector on the second circuit board.

16 Claims, 9 Drawing Sheets

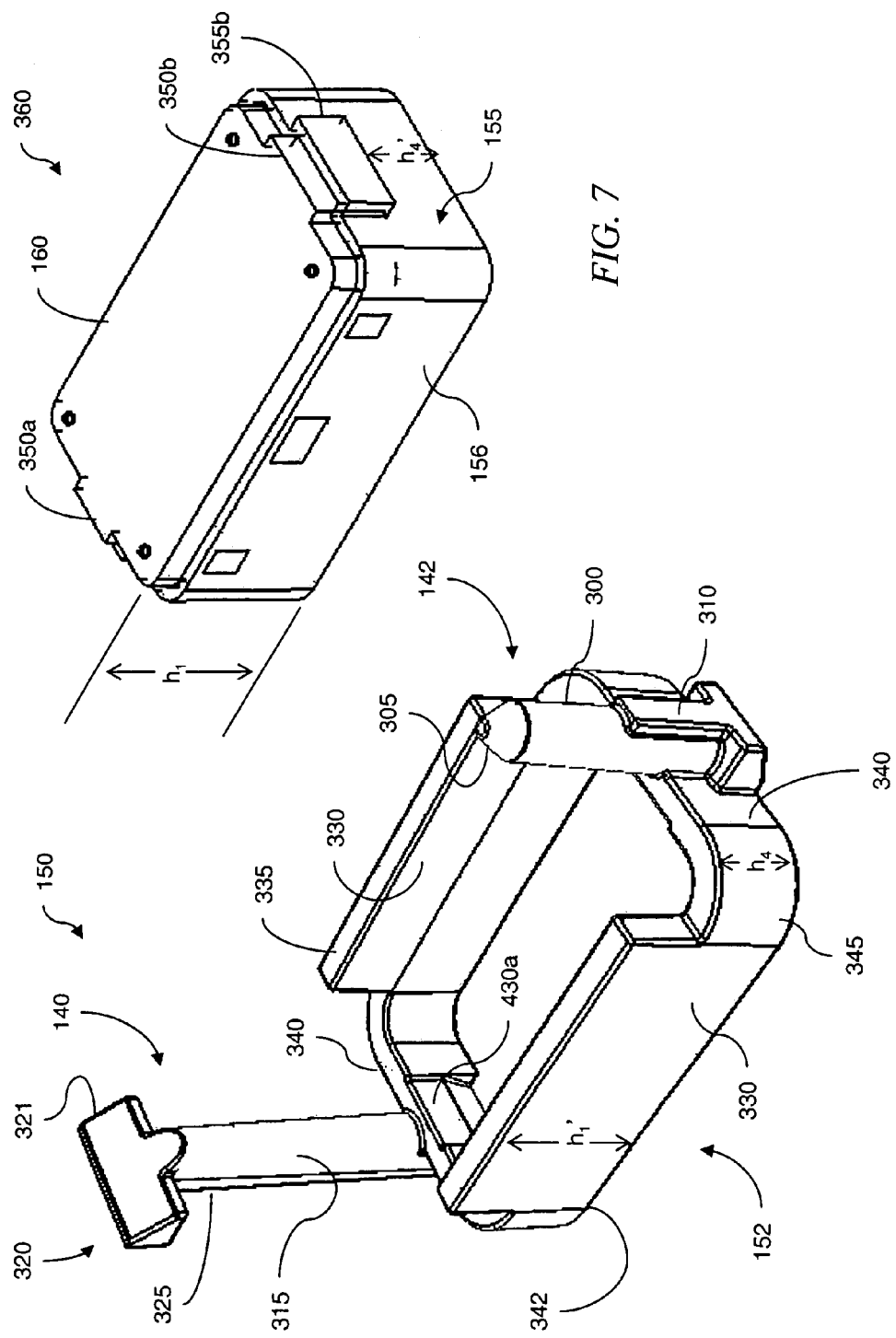

CONNECTOR-ALIGNMENT COLLAR FOR BLIND MATING ELECTRICAL CONNECTORS

FIELD OF THE INVENTION

The invention relates generally to electronic equipment assemblies that use electrical connectors to interconnect electronic subassemblies. More particularly, the invention relates to an apparatus for facilitating blind mating of electrical connectors in an electronics equipment assembly (i.e., without the aid of visual guidance).

BACKGROUND

A common approach used in the development of electronic equipment assemblies incorporates a modular design, in which multiple modules, subassemblies, or printed circuit cards are interconnected. Such an approach may simplify initial designs by allowing for the incorporation of other commercially available modules. With replaceable modules or printed circuit cards, provisioning of spares can be accomplished for each module independently, as required. An interconnected modular approach also simplifies maintainability by reducing repair tasks to board removal and replacement.

A recent trend in electronic equipment assemblies is toward higher data rates (hundreds of MHZ or higher) and smaller connector footprints. Such high data rates impose limitations on the length and manner of some electrical interconnections. Preferably, the length of interconnections should be kept to a minimum distance to avoid unwanted effects to the electrical signals. To keep interconnection length short, some designs directly interconnect overlapping or stacked circuit cards using board-to-board connectors.

Board-to-board connectors are relatively inexpensive and readily available. Some connectors have a high number of contacts distributed in a rectangular array (e.g., MEG-ARRAY® connectors) that may couple to a circuit board using a ball-grid array. Advantageously, these connectors keep interconnect lengths to a minimum. However, because of the small size and high density of contacts, damage to the connector's contacts can occur unless care is exercised during the mating and un-mating of the connector. Compounding this risk, many applications employ these delicate, high-density connectors in a blind mate configuration in which the connectors sit between overlapping circuit boards. Without an unobstructed view to the connector surfaces, the connectors are vulnerable to damage during the mating process. This can be particularly true for field replacements, where board removal and replacement occur in less-than-ideal conditions. Thus, there remains a need for improving the reliability of blind mate interconnections without unnecessarily increasing cost or complexity.

SUMMARY

In one aspect, the invention features a connector-alignment apparatus including a frame having a multi-sided base portion. The sides of the base portion define an area within which to receive a connector closely. A guide cantilever extends substantially perpendicularly from the base portion at a first side of the frame, and an alignment cantilever extends substantially perpendicularly from the base portion at a second side of the frame opposite the first side.

In another aspect, the invention features an electronic equipment assembly comprising first and second boards. The first board has an underside with a first electrical connector attached thereto, a guide notch formed along an edge of the first circuit board adjacent to one end of the first electrical connector, and an alignment hole adjacent to an opposite end of the first electrical connector. The second board has a top surface with a second electrical connector attached thereto and a frame around the second electrical connector. The frame has a multi-sided base portion with a guide cantilever extending substantially perpendicularly from a first side of the base portion and an alignment cantilever extending substantially perpendicularly from a second side of the base portion opposite the first side of the base portion. The guide notch receives the guide cantilever and the alignment hole receives the alignment cantilever to guide the mating of the first and second electrical connectors.

In another aspect, the invention features a method for blind mating a first electrical connector on a surface of a first circuit board to a second electrical connector on a underside of a second circuit board. The method comprises placing a connector-alignment collar around the first electrical connector on the first circuit board. The connector-alignment collar has a frame with a multi-sided base portion, a guide cantilever extending substantially perpendicularly from the base portion at a first side of the frame, and an alignment cantilever extending substantially perpendicularly from the base portion at a second side of the frame opposite the first side. A guide notch in an edge of the second circuit board is urged against the guide cantilever. While urging the guide notch against the guide cantilever, the alignment cantilever is inserted into an alignment hole in the second circuit board. After the alignment cantilever is inserted into the alignment hole in the second circuit board, the second electrical connector on the underside of the second circuit board mates with the first electrical connector on the surface of the first circuit board.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

FIG. 6 is a perspective view of the connector-alignment collar of FIG. 1 in more detail.

FIG. 7 is a perspective view of an exemplary connector-alignment system for use with the connector-alignment collar of FIG. 6.

DETAILED DESCRIPTION

Figure 1:
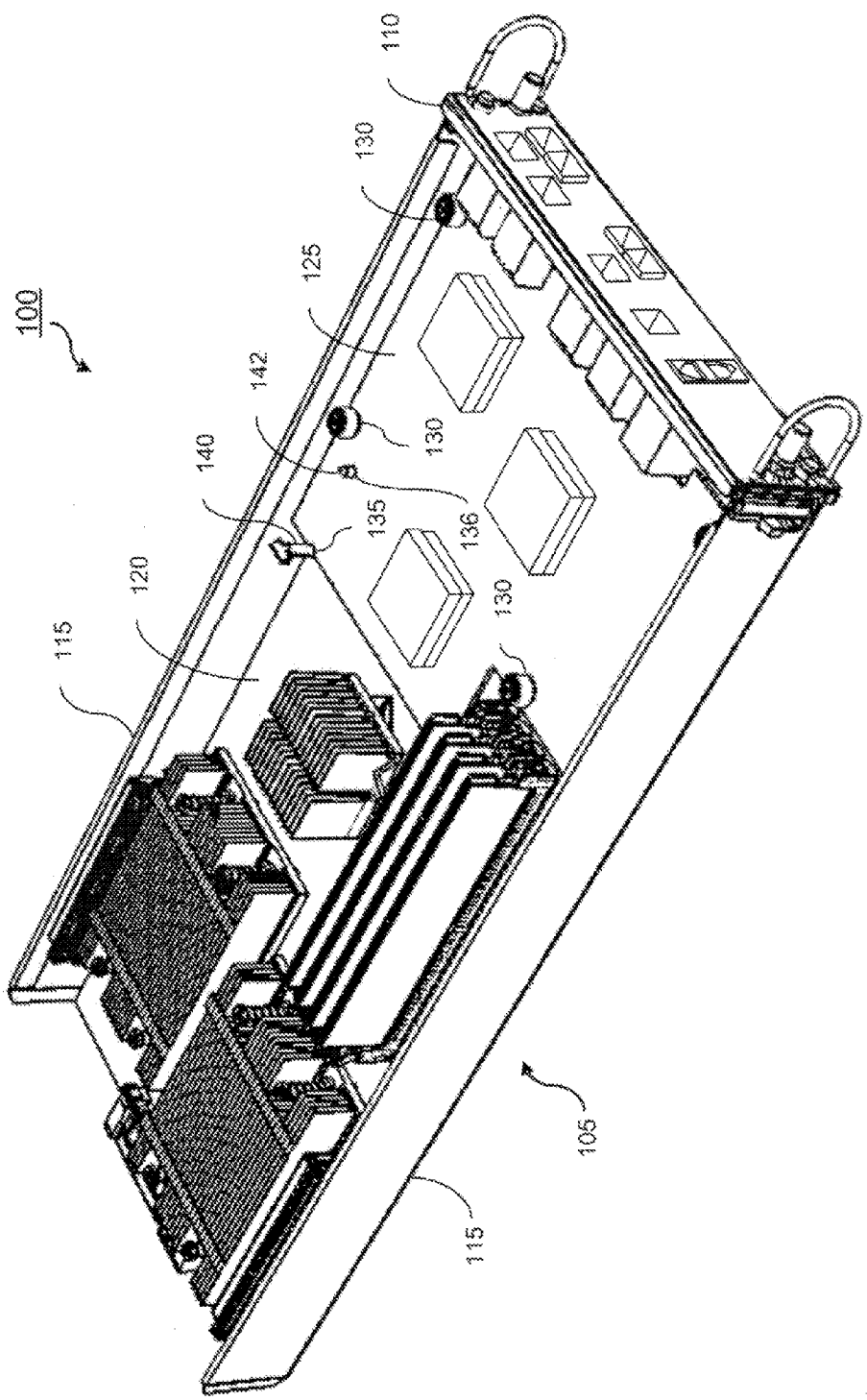
FIG. 1 is a top-perspective view of an embodiment of an electronic equipment assembly with a connector-alignment collar constructed in accordance with the invention.

Electronic equipment assemblies constructed in accordance with the present invention include a connector-alignment collar for facilitating blind mating between electrical connectors. FIG. 1 shows a top-perspective view of an embodiment of an electronic equipment assembly 100 in which aspects of the invention may be implemented. The electronic equipment assembly 100 includes a chassis 105, electronic circuitry 120 (hereinafter, a host printed circuit board, or host board), and an expansion module 125 housed therein. In some embodiments, the chassis 105 may house other devices, including other circuit boards, modules, components, and cooling devices. The chassis 105 includes a front panel 110, left and right side panels 115, and a bottom panel (not visible). The electronic equipment assembly 100 may also include top and rear panels (not shown).

The expansion module 125, sometimes referred to herein as a mezzanine board 125, includes a printed circuit board and sits spatially separated from and parallel to the host board 120 in a stacked-board configuration. One or more fasteners 130 securely fasten the mezzanine board 125 to the host board 120. In addition, the mezzanine board 125 is electrically coupled to the host board 120 through one or more connector-alignment systems, described in more detail below. To facilitate the board-to-board interconnection between the host board 120 and the mezzanine board 125, the host board 120 includes a connector-alignment collar 150 (FIG. 2) having a guide cantilever 140 and an alignment cantilever 142 (which project above the plane of the mezzanine board 125). The mezzanine board 125 has a guide notch 135 and an alignment hole 136 for engaging the guide cantilever 140 and alignment cantilever 142, respectively, when the mezzanine board 125 is coupled to the host board 120. The two cantilevers 140, 142, the guide notch 135, and the alignment hole 136 facilitate mating and unmating of the host and mezzanine boards 120, 125, described more fully below.

Figure 2:
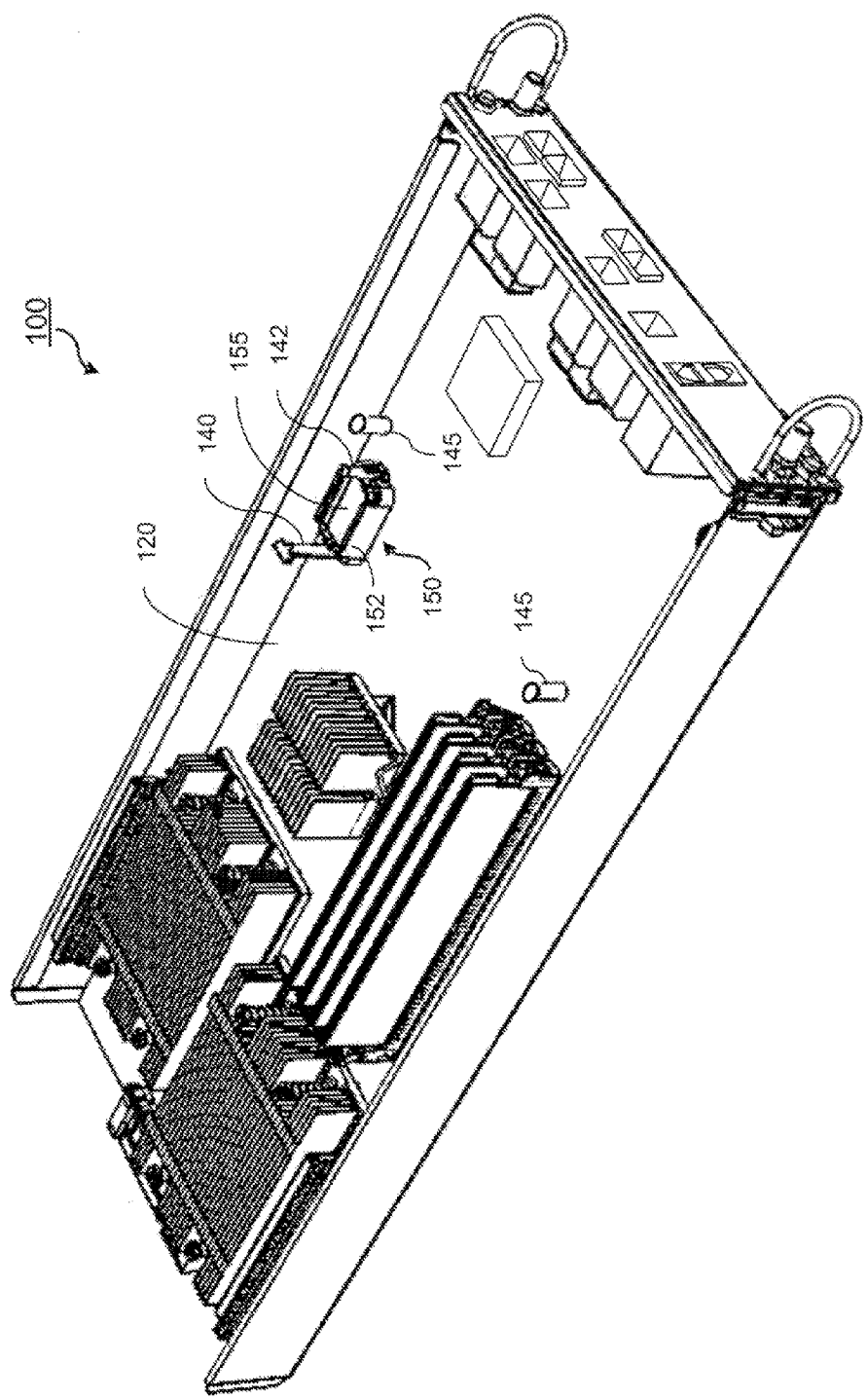
FIG. 2 is a perspective view of the electronic equipment assembly of FIG. 1 having a mezzanine board removed revealing the connector-alignment collar.

FIG. 2 shows the electronic equipment assembly 100 with the mezzanine board 125 removed to reveal the host board 120 with the connector-alignment collar 150 on a surface thereof. The connector-alignment collar 150 frames a host board (electrical) connector 155. The connector-alignment collar 150 includes a base frame 152 from which the guide cantilever 140 and the alignment cantilever 142 extend. The host board 120 includes standoffs 145 for supporting the mezzanine board 125 (FIG. 1), in conjunction with the connector-alignment collar 150, as described below.

Figure 3:
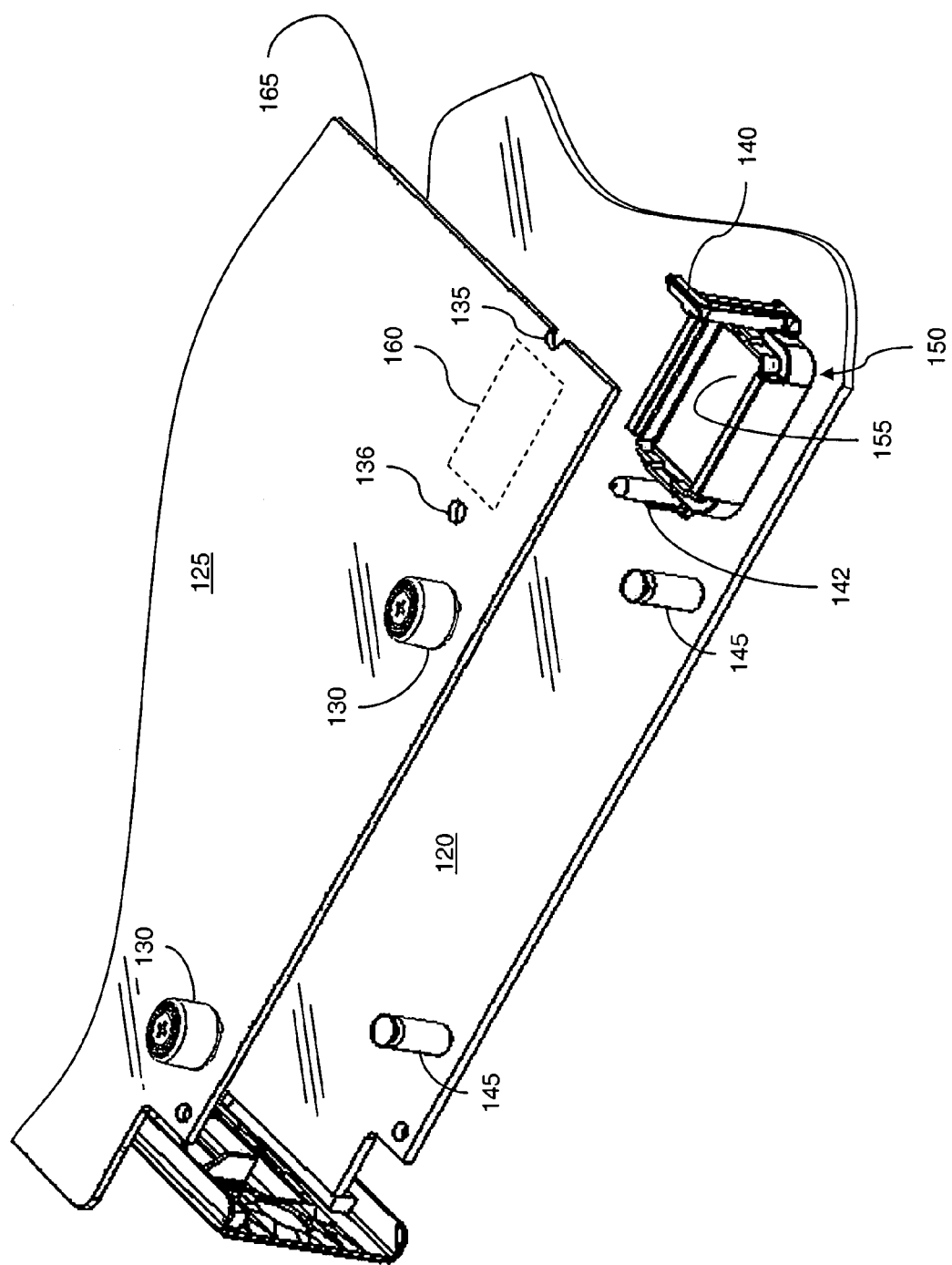
FIG. 3 is a perspective cut-away view detailing the mezzanine board modified in accordance with the invention and spatially separated from a host board of the electronic equipment assembly with the connector-alignment collar of FIG. 2 on a surface thereof.

FIG. 3 shows the mezzanine board 125 disconnected from the host board 120 and positioned above the host board 120 as may occur during installation and removal from the chassis 105. Extending from an underside surface of the mezzanine board 125 is an electrical connector 160 for mating with the host board connector 155 on the host board 120.

The location of the electrical connectors 155, 160, between the host board 120 and the mezzanine board 125, can make their mating difficult because of the limited or nonexistent visual access to the connectors 155, 160. Although visual access of the connectors 155, 160 may be possible from the side (i.e., between the host board 120 and the mezzanine board 125), such access would be inhibited here by the chassis side panels 115 (FIG. 1). A configuration in which the connectors 155, 160 mate while being obstructed from view can be referred to as a "blind mate." The front panel 110 of the electronic equipment assembly 100 (FIG. 1) can be removed to facilitate the joining of the host and mezzanine boards 120, 125 when blind mating their respective connectors 155, 160.

The standoffs 145 of the host board 120 can be used as a rough alignment aid. That is, the mezzanine board 125 can be positioned above the host board 120 and mounting holes in the mezzanine board 125 aligned with their respective standoffs 145. This provides a rough alignment, at best, and may not be possible when the mezzanine board 125 includes captive fasteners 130 adapted for engaging the standoffs 145. This would result in the equivalent of a blind mate of the fasteners 130 to the standoffs 145 providing "rough alignment" for mating the connectors 155, 160.

The mezzanine board 125 includes the guide notch 135 adjacent to one end of the mezzanine board connector 160 and along the rear edge 165 of the mezzanine board 125. The size and location of the guide notch 135 are for engaging a side surface of the guide cantilever 140 of the connector-alignment collar 150. The guide notch 135 facilitates initial positioning of the mezzanine board 125 above the host board 120 during installation.

The mezzanine board 125 also includes an alignment hole 136 disposed adjacent to and at the other end of the mezzanine board connector 160 (i.e., on opposite sides of the mezzanine board connector 160 from the guide notch 135). The size and location of the alignment hole 136 are for receiving the alignment cantilever 142 of the connector-alignment collar 150. The alignment hole 136 facilitates a proper orientation and alignment of the mezzanine board 125, and hence the mezzanine board connector 160, with respect to the host board connector 155. Completion of the mating, as described more fully below, can be accomplished by urging the mezzanine board 125 against the host board 120 once the guide notch 135 and alignment hole 136 have suitably engaged the guide cantilever 140 and alignment cantilever 142, respectively.

Figure 4A:
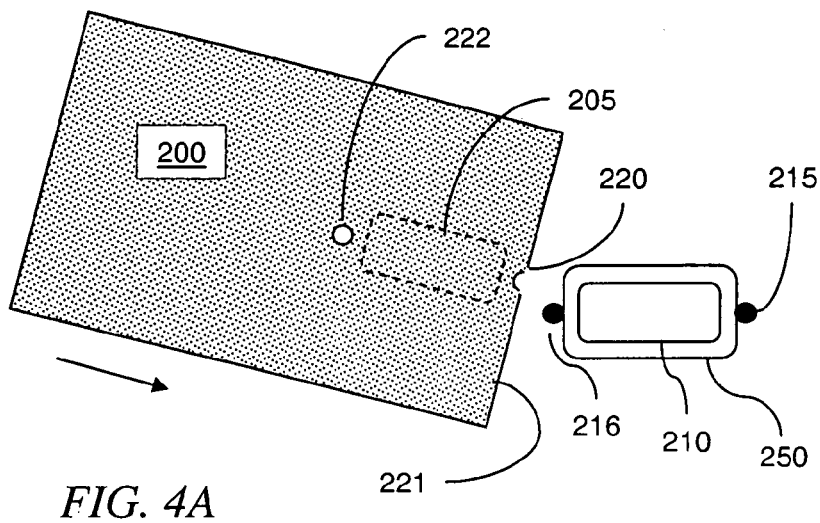
FIG. 4A, FIG. 4B, and FIG. 4C schematically represent an example of an alignment procedure for connecting an electrical connector on a underside of a mezzanine board, constructed in accordance with the invention, to a host board receptacle using the connector-alignment collar to guide the mating process.
Figure 4B:
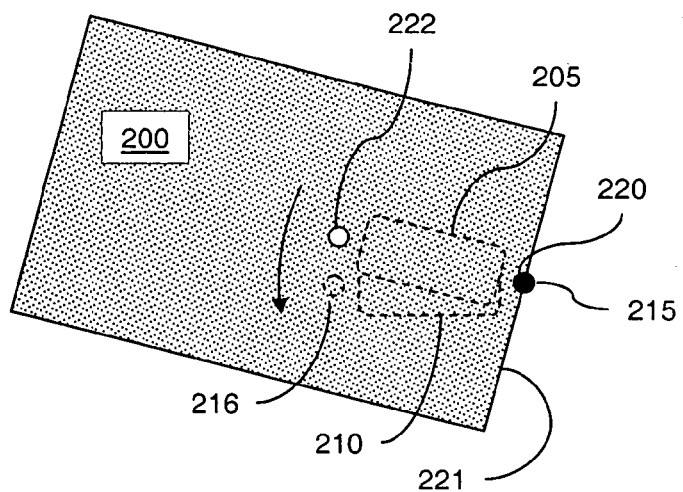
Figure 4C:
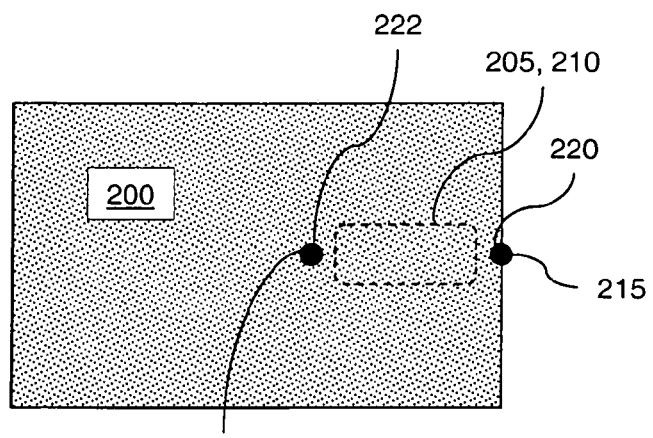

FIG. 4A, FIG. 4B, and FIG. 4C schematically represent an example of an alignment procedure for connecting a mezzanine board connector 205 to a host board connector 210. Referring to FIG. 4A, a top view of the host board connector 210 is shown in a relative, fixed position. Adjacent to a distal end of the host board connector 210 is a guide cantilever 215 of a connector-alignment collar 250. Disposed adjacent to an opposite, proximal end of the host board connector 210 is an alignment cantilever 216 of the connector-alignment collar 250. A mezzanine board 200, also viewed from the top, includes a guide notch 220 defined along a rear edge 221 of the mezzanine board 200. The mezzanine board connector 205 (shown in phantom) is disposed on an underside of the mezzanine board 200 with one end adjacent to the guide notch 220. The mezzanine board 200 also includes an alignment hole 222 (through the mezzanine board 200), such that the mezzanine board connector 205 is disposed between the guide notch 220 and the alignment hole 222.

During an installation procedure, the mezzanine board 200 is initially positioned in a plane above the host board connector 210, with its rear edge 221 proximal to the guide cantilever 215 (here, the left side, as shown). The mezzanine board 200 may be aligned in a plane parallel to the host board connector 210, although this is not necessary at this juncture. The rear edge 221 is below a tip of the guide cantilever 215 (the tip pointing out of the page). The rear edge 221 of the mezzanine board 200 is then moved distally toward the guide cantilever 215, bringing the guide notch 220 into engagement with a side surface of the guide cantilever 215.

FIG. 4B shows a top view of the rear edge 221 of the mezzanine board 200 engaging the side surface of the guide cantilever 215. Without any effort to align the mezzanine board 200 beyond this initial engagement, the mezzanine board connector 205 has not yet been aligned above the host board connector 210. Having a single point of engagement at the guide cantilever 215, the mezzanine board 200 can be rotated about the guide cantilever 215, as indicated by the arrow, until the alignment hole 222 is aligned above the alignment cantilever 216. Once aligned, the mezzanine board 200 can be urged against the host board connector 210 to complete the interconnection.

FIG. 4C shows a top view of the properly aligned mezzanine board 200 with the alignment cantilever 216 extending through the alignment hole 222 and the guide cantilever 215 seated within the guide notch 220. The mezzanine board connector 205 is now aligned directly above the host board connector 210, the connectors 205, 220 being mated by urging the mezzanine board 200 against the host board connector 210. Connector alignment is ensured during this last step by the guide cantilever 215 and alignment cantilever 216.

Some board-to-board connectors can be mated "straight" with the plug and receptacle mating along an approach perpendicular to the mating plane. Some manufacturers recommend a different procedure for mating and unmating large pin count, high-density (e.g., two-dimensional, 400 position) connectors. Namely, a rolling motion is recommended, because it requires less effort. With the rolling motion, the plug (e.g., the mezzanine board connector 205) is first aligned above the host board connector 210 and then angled slightly, such that one end of the plug 205 contacts the host board connector 210 before the other end. The other end of the plug 205 is then directed toward the host board connector in the rolling motion to complete the mating procedure. Detaching (i.e., unmating) occurs in a similar manner (in reverse order).

Figure 5:
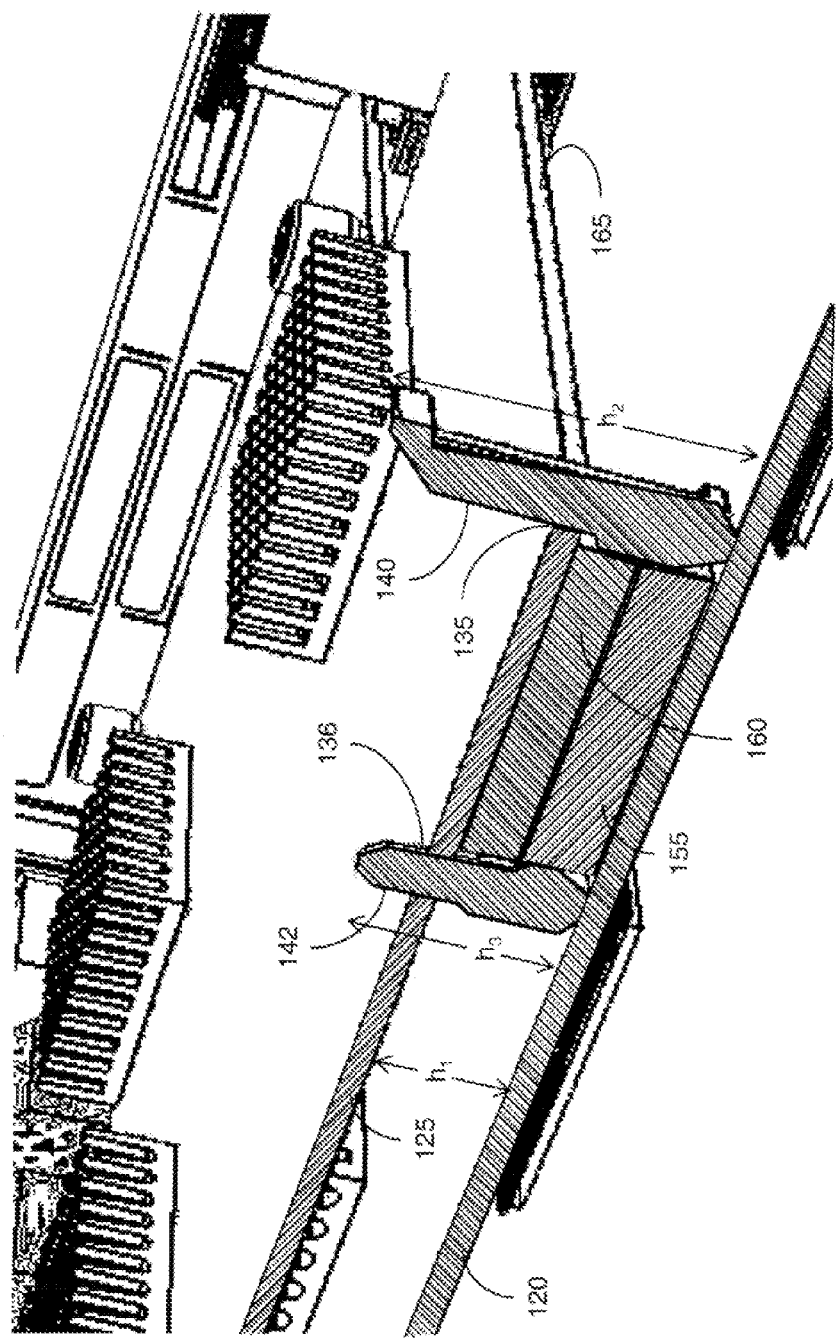
FIG. 5 is a cross-sectional view of a portion of the electronic equipment assembly of FIG. 1, taken through a centerline of the connector-alignment collar.

FIG. 5 shows a cross-sectional view of the electronic equipment assembly 100, taken through a centerline of the connector-alignment collar 150. As shown from a side perspective view is the spacing, or height $h_1$, between the top surface of the host board 120 and the bottom surface of the mezzanine board 125. The mezzanine board connector 160 is also shown in cross-section being mated with the host board connector 155. Also shown in the side view are the respective heights of the guide cantilever 140, $h_2$, and the alignment cantilever 142, $h_3$. The height $h_2$ of the guide cantilever 140 is greater than the height $h_3$ of the alignment cantilever 142, to allow the mezzanine board 125 to first abut a side surface of the guide cantilever 140, without interfering with the alignment cantilever 142. In other embodiments, the guide cantilever 140 and alignment cantilever 142 can have equal or approximately equal heights. During an installation technique, referred to as "toe in," when mating the connectors 155, 160, the rear edge 165 of the mezzanine board 125 is lowered first toward the host board 120, while the front edge of the mezzanine board 125 remains slightly upraised relative the rear edge. (The front panel 110 (FIG. 1) can be removed to provide space for the toe-in insertion of the mezzanine board 125.) With this approach, the distal ends of the connectors are allowed to engage first, before the proximal end does. Such a "toe in" approach may also facilitate insertion of the mezzanine board 125 within the chassis 105 (FIG. 1).

FIG. 6 shows an embodiment of the connector-alignment collar 150 including the base frame 152, and the guide cantilever 140 and the alignment cantilever 142 extending perpendicularly from opposite ends of the base frame 152. The base frame 152 includes a closed perimeter including two opposing sidewalls 330 joined at each end by the end walls 340. The guide cantilever 140 and alignment cantilever 142 are joined at opposite end walls 340. The sidewalls 330 and end walls 340 form the closed perimeter dimensioned to enclose the host board connector 155 (FIG. 3). In some embodiments, the base frame 152 may include an open perimeter, such as a configuration having one sidewall 330 only and the end walls 340.

The base frame 152 has a bottom surface 342 that sits on the host board 120 when the connector-alignment collar 150 couples to the host board connector 155, as described below. The bottom surface 342 includes a base portion of the sidewalls 330 and end walls 340. The walls 330, 340 extend perpendicularly from the host board 120 when the connector-alignment collar 150 sits thereon. The sidewalls 330 have a height $h_1'$ measured from their base (e.g., from the surface of the host board 120). The top of the sidewalls 330 each form a crest 335, substantially parallel to the bottom surface 342. The end walls 340 have a height $h_4$, measured from their base, that is shorter than the sidewalls 330. Additionally, the shorter end walls 340, including a shortened corner portion 345 joining the end walls 340 to the sidewalls 330, facilitate locking the connector-alignment collar 150 in place with respect to the host board 120.

The alignment cantilever 142 includes an elongated column 300 coupled at its base to one of the end walls 340. The alignment cantilever 142 is substantially rigid, such that it does not bend during insertion of the mezzanine board 125, to promote proper alignment of the mezzanine board connector 160 with the host board connector 155. To reinforce the alignment cantilever 142, a reinforcing rib 310 can be included along at least a base portion of the rigid column 300. The height of the reinforcing rib 310 does not extend above the height of the sidewall 330, to ensure that the rib 310 does not interfere with the entry of the alignment cantilever 142 into the alignment hole 136 (FIG. 3).

The alignment cantilever 142 includes at its top a tapered extension 305. The tapered extension 305 may include a cone, as shown, to promote a capture and gross alignment of the mezzanine board 125 (FIG. 3). The rigid column 300 may also taper along its length towards the top to provide a loose alignment when first inserted into the alignment hole 136, the alignment being refined as the alignment hole 136 moves down the length of the column 300, with any clearance therebetween being diminished by the taper.

The guide cantilever 140 includes an elongated column 315 coupled at its base to the other end wall 340. The guide cantilever 140 is substantially rigid, such that it does not bend during insertion of the mezzanine board 125, to promote proper alignment of the mezzanine board connector 160 with the host board connector 155. To reinforce the guide cantilever 140, a reinforcing rib 325 can be included. Preferably, the reinforcing rib 325 is located along an outer edge of the elongated column 315, facing away from the base frame 152. Being placed along an outer edge, there is no height restriction, so the reinforcing rib 325 can extend the entire length of the elongated column 315, as shown. The guide notch 135 (FIG. 3) abuts only an inner edge of the elongated column 315, so the reinforcing rib 325 does not interfere with guide notch 135.

The guide cantilever 140 includes a crown 320 at its outer end. Since the guide notch 135 (FIG. 3) approaches the guide cantilever 140 from the side, without having to fit necessarily over the crown 320, there is no related restrictions to the size of the crown 320. In some embodiments, the crown 320 includes an enlarged member, such as the T-shaped handle 321 shown. A larger crown can serve as a visual aid to assist in locating the guide cantilever 140 during installation of the mezzanine board 125. Additionally, a larger crown 320 can facilitate removal of the connector-alignment collar 150 itself by providing the T-shaped handle 321, discussed further below.

FIG. 7 shows a perspective view of an exemplary connector system 360 usable in combination with the connector-alignment collar 150 (FIG. 6). The connector system 360 includes a mating connector pair consisting of the host board connector 155 and the mezzanine board connector 160. In one embodiment, the host board connector 155 is a receptacle and the mezzanine board connector 160 is a plug. One exemplary connector system includes MEG-ARRAY® connectors, available in connector sizes spanning 80 to 528-contact positions with the capability to support board-to-board stack heights from 4 to 14 mm, in increments of 2 mm. FCI USA Inc part no. 84520-002 represents an exemplary 400-position mezzanine board connector 160 with a 6.0 mm stack height. Part no. 74390-001 represents an exemplary mating 400-position host board connector 155 having a stack height of 8.0 mm. These connectors are available from FCI USA, Inc., of Etters, Pa.

The exemplary MEG-ARRAY® connector system 360 includes a key to assure proper mating orientation. The host board connector 155 includes a base portion 156 surrounding its perimeter that includes a large slot 355b at one end and a small slot 355a (not visible) at the other end. The mating mezzanine board connector 160 includes a large key 350b at one end and a small key 350a at the other end. The locations and sizes of the keys 350a, 350b are for interlocking with the slots 355a, 355b when the mezzanine board connector 160 is in the proper orientation with respect to the host board connector 155.

The height $h_1$ of the overall mated connector system 360, when the mezzanine board connector 160 is properly mated with the host board connector 155, is often a predefined or specified value, sometimes referred to as the "stack height." For applications in which the connector system 360 is used between adjacent circuit boards, the specified stack height typically corresponds to the spacing, $h_1$, between the boards 120, 125 (FIG. 5). Referring again to FIG. 6, the height $h_1'$ can be equal to, or slightly greater than, the combined stack height $h_1$ of the connector system 360. Thus, the crest 335 forms a bearing surface to support the mezzanine board 125 at a defined height according to the requirements of the connector system 360. Any standoffs 145 (FIG. 2) would generally be provided at the same height $h_1'$ so that the installed mezzanine board 125 is substantially parallel to the host board 120.

Figure 8:
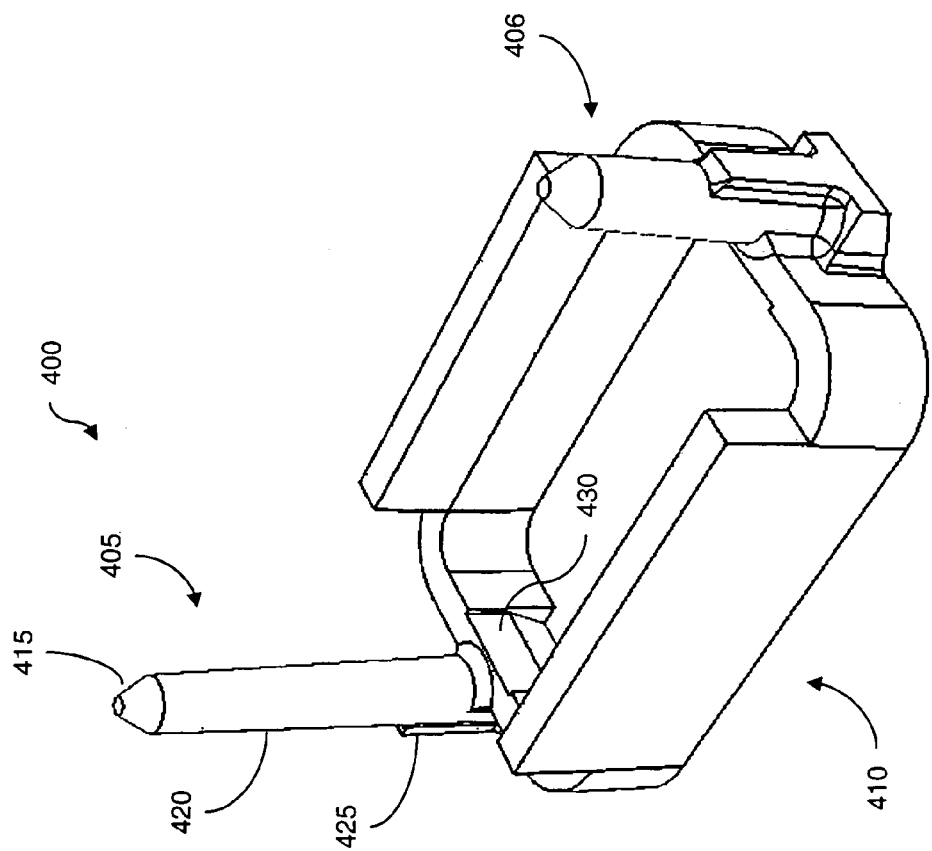
FIG. 8 is a perspective view of an alternative embodiment of a connector-alignment collar constructed in accordance with the invention.

FIG. 8 shows a perspective view of an alternative embodiment of a connector-alignment collar 400 constructed in accordance with the invention. The connector-alignment collar 400 also includes a base frame 400 coupled at one end to an alignment cantilever 406 and at an opposite end to a guide cantilever 405. Many aspects of the connector-alignment collar 400 are similar to the connector-alignment collar 150 of FIG. 6, with a primary exception of the guide cantilever 405. Here, the guide cantilever 405 is different, being similar in construction to the alignment cantilever 406; that is, the guide cantilever 405 includes an elongated rigid column 420 terminating in a tapered end 415. Again, the tapered end 415 may include a conical taper as shown.

The guide cantilever 405 also includes a reinforcing rib 425 on an exterior side, but the height of the reinforcing rib is limited to the height of the base frame 410 (e.g., the height of the sidewalls), so that the reinforcing rib 425 does not interfere with a guide hole (not shown). Namely, the connector-alignment collar 400 can mate with a mezzanine board having a guide hole, instead of a guide notch, and an alignment hole. The mezzanine board can then be aligned with both cantilevers 405, 406 inserted into the respective holes of the mezzanine board. In general, one of the two cantilevers 405, 406 can be longer than the other cantilever—here, the guide cantilever is longer than the alignment cantilever—to promote aligning the holes of the mezzanine board with the cantilevers.

Figure 9:
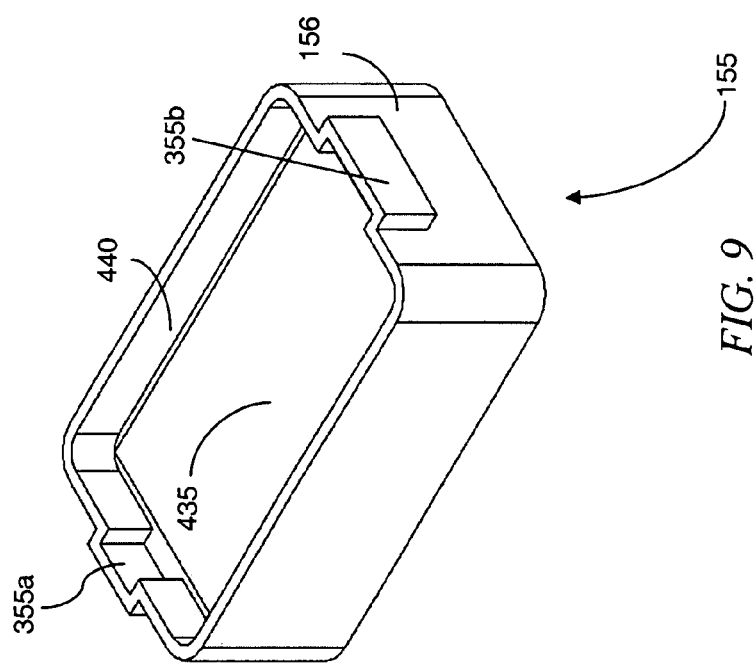
FIG. 9 is a perspective view of an embodiment of a host board receptacle of the connector-alignment system of FIG. 7.

FIG. 9 shows in more detail a perspective view of the host board connector 155 including a host connector insert 435 within the receptacle base 156. The host board connector 155 also includes a top support member 440 formed by a portion of the receptacle base 156 that extends above a mating surface of the host connector insert 435 (the insert 435 includes the electrical contacts of the host board connector 155. The top support member 440 includes the large slot 355b and small slot 355a, which receive the keys 350a, 350b of the mezzanine board connector 160 when mezzanine board connector 160 mates with the host board connector 155.

Figure 10A:
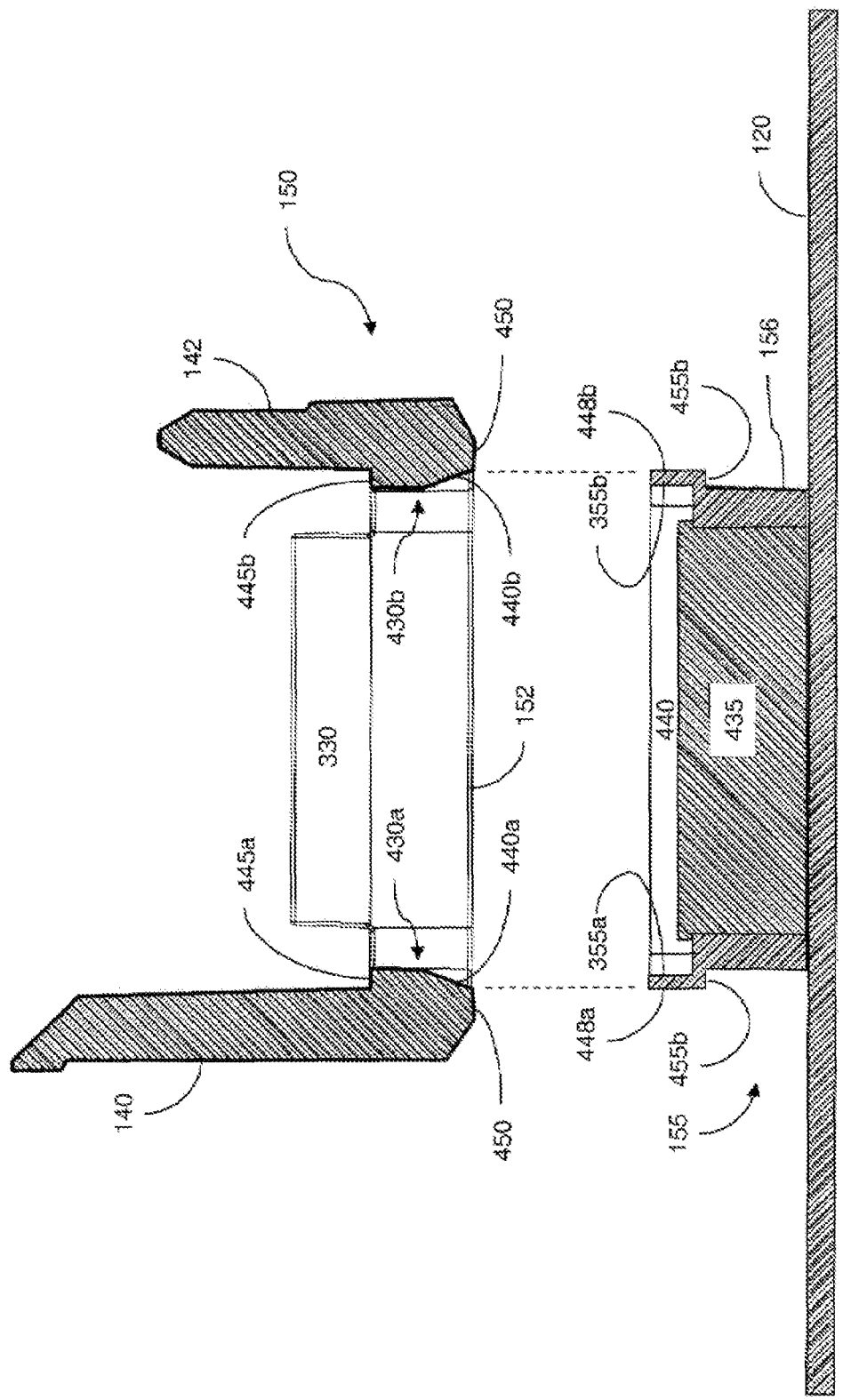
FIG. 10A is a cross-sectional view of the connector-alignment collar of FIG. 6 in alignment with the host board receptacle of FIG. 9.

FIG. 10A shows a cross-sectional view of the connector-alignment collar 150 in alignment above the host board connector 155. The cross-section is in a plane perpendicular to the host board 120 and bisecting the guide cantilever 140 and the alignment cantilever 142. Two channels 430a, 430b are formed along the interior surface of the base frame 152 and at a base portion of the cantilevers 140, 142. Each of the channels 430a, 430b includes a retaining surface 445a, 445b at one end and a guiding surface 440a, 440b at the other. Here, the guiding surfaces 440a, 440b are formed along a bottom edge 450 of the base frame 152.

The receptacle base 156 includes two end-facing projections 448a, 448b, one disposed at each end of the host board connector 155 and extending outwardly therefrom. In some embodiments, the end-facing projections 448a, 448b are formed along exterior surfaces of the small slot 355a and the large slot 355b, each including a locking surface 455a, 455b adapted to "snap-fit" into the channels 430a, 430b, respectively.

Referring again to the perspective view of the connector-alignment collar 150 of FIG. 6, the relative width of one of the channels 430a is shown. The width of the channels 430a, 430b are wide enough to accept the width of the corresponding end-facing projection 448a, 448b.

The connector-alignment collar 150 is attachable and detachable from the host board connector 155, enabling use of the connector-alignment collar 150 with a host board connector of choice. Such a modular approach allows relatively inexpensive connectors to be used in blind mate applications. Being able to add a blind-mate alignment feature in a modular fashion is valuable, because it increases the applications for which such connectors may be used.

The connector-alignment collar 150 attaches to the host board connector 155 by urging the bottom edge 450 of the connector-alignment collar 150 against the top of the receptacle base 156. The top of the lateral projections 448a, 448b engage guiding surfaces 440a, 440b, directing the lateral projections 448a, 448b of the host board connector 155 into the channels 430a, 430b, respectively. The connector-alignment collar 150 is urged toward the receptacle base 156, until the locking surfaces 455a, 455b snap-fit against the respective retaining surfaces 445a, 445b. Preferably, the channels 430a, 430b are compliant to facilitate the snap-fit engagement. Engagement of end-facing projections 448a, 448b with the channels 430a, 430b, may aid with the securing of the connector-alignment collar 150 to the host board connector 155. Since the host board connector 155 is securely fastened to the host board 120, the connector-alignment collar 150 is also secured thereto.

End-facing projections 448a, 448b and channels 430a, 430b, may have any of a number of configurations, with a generally rectangular protruding configuration being one preferred example. It should also be noted that the end-facing projections 448a, 448b and channels 430a, 430b may be reversed such that end-facing projections 448a, 448b are formed within the interior surface of the connector-alignment collar 150, with channels 430a, 430b formed in the receptacle base 156.

Figure 10B:
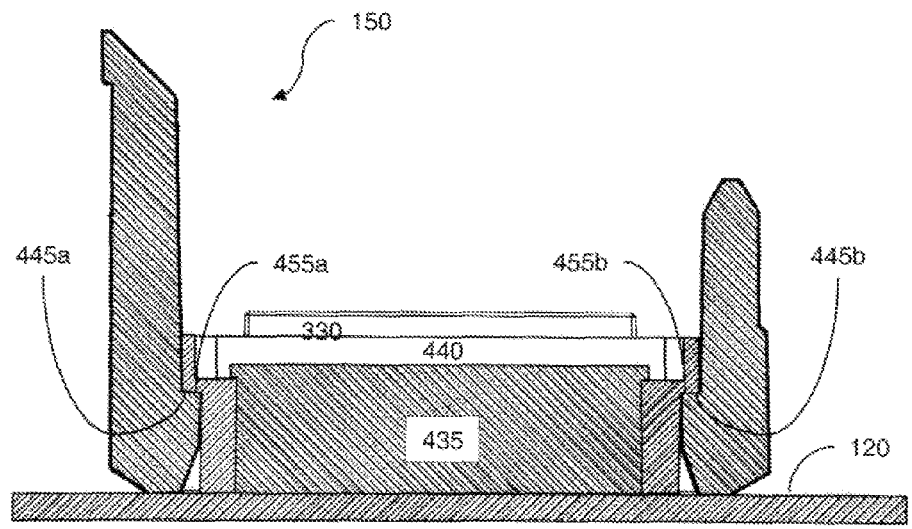
FIG. 10B is a cross-sectional view of the connector-alignment collar coupled to the host board receptacle.

FIG. 10B shows a cross-sectional view of the connector-alignment collar 150 and host board connector 155 in a mated configuration. In particular, engagement of the locking surfaces 455a, 455b with corresponding retaining surfaces 445a, 445b is shown.

Figure 10C:
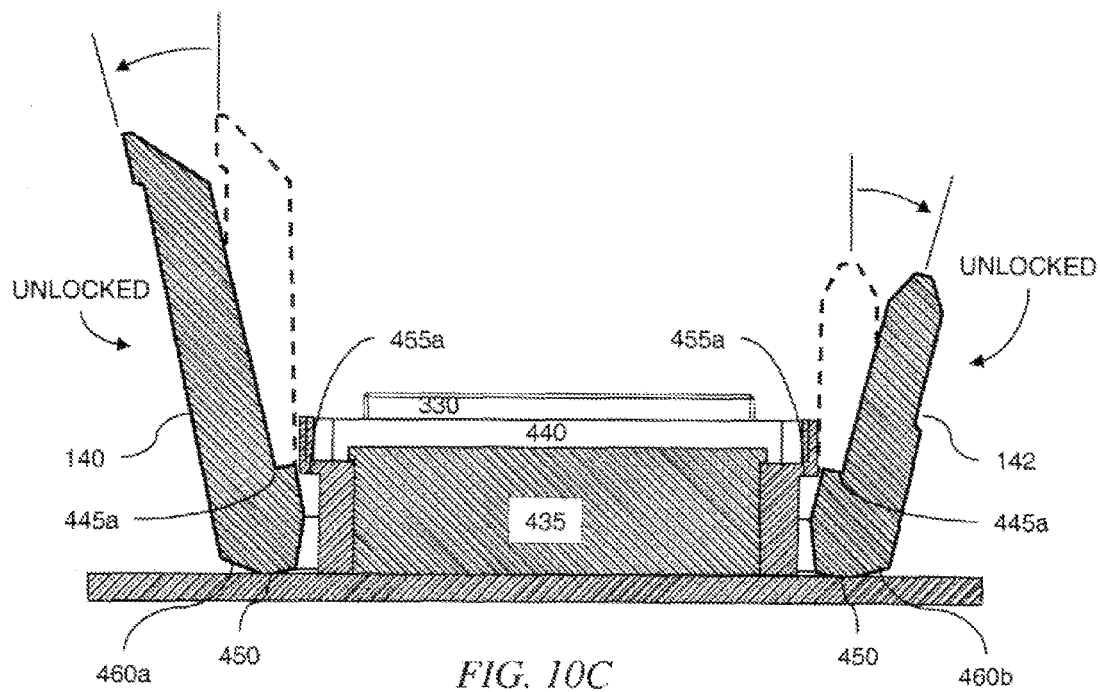
FIG. 10C is a view of the connector-alignment collar coupled to the connector-alignment system, with the guide and alignment cantilevers of the connector-alignment collar being pivoted for detaching the connector-alignment collar from the host board receptacle.

FIG. 10C shows the connector-alignment collar 150 manipulated for disengagement from the host board connector 155. Each of the cantilevers 140, 142 includes a beveled surface 460a, 460b along an outer edge of its base portion. The beveled surfaces 460a, 460b extend away from the bottom edge 450 and form a rocker bearing allowing the cantilevers 140, 142 to pivot in an outward direction from their base portions at the bottom edge 450. The cantilevers 140, 142 are illustrated in an "open" position, with the closed positions shown in phantom.

Outward rotation of the cantilevers 140, 142 removes interference of the locking surfaces 455a, 455b from their corresponding retaining surfaces 445a, 445b, such that the connector-alignment collar 150 can be removed from the host board 120 by lifting it away from the host board 120. (Here, the T-shaped handle 321 of FIG. 6 can be useful in providing a grip for removing the connector-alignment collar 150 from the host board 120.) The base frame 152 (FIG. 10A) is sufficiently flexible to allow sufficient displacement of the cantilevers 140, 142. In some embodiments, the base frame 152 (FIG. 6) includes a relatively short end wall 340 and corner segment 345 to facilitate flexibility for the cantilever action of the cantilevers 140, 142. The length of the cantilevers 140, 142 also facilitates generation of sufficient torque to achieve the pivoting action, such that tools are not required.

Additionally, detachability of the connector-alignment collar 150 without tools facilitates preparation of the host board 120 for rework, should that be necessary. In some applications, the connector-alignment collar 150 is integrally formed and made of a plastic. Should the host board 120 require a solder re-flow procedure, removal of the connector-alignment collar 150 might be necessary to prevent it from being damaged (i.e., melted) during the re-flow.

While the invention has been shown and described with reference to specific preferred embodiments, it should be understood by those skilled in the art that various changes in form and detail may be made therein without departing from the spirit and scope of the invention as defined by the following claims.

The invention claimed is:

1. A connector-alignment apparatus for facilitating mating of a first connector coupled to a first board with a second connector coupled to a second board, the apparatus comprising:

a frame having a plurality of sides that encloses an area within which to receive the first connector closely;

a guide cantilever extending from a first side of the frame; and an alignment cantilever extending from a second side of the frame opposite the first side of the frame, each cantilever having a first end and a second end, the first end of each cantilever having a retaining surface for coupling that cantilever to the first connector and for securing the frame to the first connector, and the second end of each cantilever providing a guide for aligning the second board with the first board such that the second connector is brought into mating alignment with the first connector when the first connector is disposed within the enclosed area of the frame.

2. The connector-alignment apparatus of claim 1, wherein the length of the guide cantilever is greater than the length of the alignment cantilever.

3. The connector-alignment apparatus of claim 1, wherein the second end of at least one of the guide cantilever and the alignment cantilever is tapered.

4. The connector-alignment apparatus of claim 1, wherein the first side of the frame includes a channel within the enclosed area for receiving a locking surface of the first connector.

5. The connector-alignment apparatus of claim 1, wherein the guide cantilever is integrally formed with the first side of the frame and the alignment cantilever is integrally formed with the second side of the frame.

6. The connector-alignment apparatus of claim 1, wherein the guide cantilever includes a T-shaped crown at the second end thereof.

7. The connector-alignment apparatus of claim 1, wherein two opposing sides of the frame each have a crest for supporting the second board thereon when the first and second connectors are mated.

8. The connector-alignment apparatus of claim 1, wherein each of the guide and alignment cantilevers includes means for coupling to the first connector.

9. The connector-alignment apparatus of claim 1, wherein the first end of each cantilever has an exterior beveled side for enabling that cantilever to pivot outwardly from the first connector within the frame and thereby decouple the retaining surface of that cantilever from the first connector.

10. A connector-alignment apparatus for facilitating mating of a first connector on a first board with a second connector on a second board, the apparatus comprising:

a frame having a plurality of sides, an open top, and an open bottom, the plurality of sides enclosing an area sized to receive closely the first connector on the first board through the open bottom, first and second opposing sides of the frame each having a channel for receiving an outwardly projecting section of the first connector, each channel including a retaining surface for entering a locked engagement with a surface of the projecting section of the first connector; and first and second elongate cantilevers, each cantilever being coupled adjacent to one of the channels in the first and second sides of the frame, at least one of the first and second cantilevers having an end shaped for fitting into an opening in the second board for aligning the second connector on the second board with the first connector on the first board when blind-mating the connectors.

11. The connector-alignment apparatus of claim 10, wherein the length of one cantilever is greater than the length of the other cantilever.

12. The connector-alignment apparatus of claim 10, wherein the shaped end of at least one of the first and second cantilevers is tapered.

13. The connector-alignment apparatus of claim 10, wherein the first cantilever is integrally formed with the first side of the frame and the second cantilever is integrally formed with the second side of the frame.

14. The connector-alignment apparatus of claim 10, wherein the first cantilever includes a T-shaped crown at one end thereof.

15. The connector-alignment apparatus of claim 10, wherein two opposing sides of the frame each have a crest for supporting the second board thereon when the first and second connectors are mated.

16. The connector-alignment apparatus of claim 10, wherein the first end of each cantilever has an exterior beveled side for enabling that cantilever to pivot outwardly from the first connector within the frame and thereby decouple the retaining surface of the channel adjacent to which that cantilever is coupled from the first connector.

* * * * *